US008614896B2

(12) United States Patent
Wu et al.

(10) Patent No.: US 8,614,896 B2
(45) Date of Patent: Dec. 24, 2013

(54) UNLOCKING APPARATUS FOR PRINTED CIRCUIT BOARD (75) Inventors: Chia-Kang Wu, New Taipei (TW); Li-Ping Chen, New Taipei (TW); Yao-Chung Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 183 days.

(21) Appl. No.: 13/369,384

(22) Filed: Feb. 9, 2012

(65) Prior Publication Data

US 2012/0314387 A1 Dec. 13, 2012

(30) Foreign Application Priority Data

Jun. 9, 2011 (TW) .............................. 100120233 A (51) Int. Cl.
*H05K 5/00* (2006.01)
*G06F 1/18* (2006.01)
(52) U.S. Cl.
CPC ....................................... *G06F 1/18* (2013.01)
USPC .......................................... 361/754; 361/726
(58) Field of Classification Search
CPC ........... G06F 1/18; G06F 1/184; G06F 1/185; H05K 7/1402
USPC .......................... 361/726, 732, 755, 759, 798
See application file for complete search history.

(56) References Cited

U.S. PATENT DOCUMENTS

| 5,997,326 | A | * | 12/1999 | Koradia et al. | ............... 439/160 |
| 6,147,872 | A | * | 11/2000 | Roy | .............................. 361/754 |
| 6,618,264 | B2 | * | 9/2003 | Megason et al. | .............. 361/759 |
| 7,443,667 | B2 | * | 10/2008 | Guo et al. | ................. 361/679.33 |
| 8,427,843 | B2 | * | 4/2013 | Zhang et al. | .................. 361/801 |
| 8,514,585 | B2 | * | 8/2013 | Zhang et al. | .................. 361/796 |

* cited by examiner

*Primary Examiner* — Yuriy Semenenko
(74) *Attorney, Agent, or Firm* — Altis Law Group, Inc.

(57) ABSTRACT

An unlocking apparatus for printed circuit board, configured for detaching a circuit board, includes a clipping structure secured to the circuit board, two unlocking structures and a chassis. The chassis includes bracket for mounted the circuit board. Each of the two unlocking structures includes a dragging member, a rotating member, a sliding member and a supporting member. The pulling rod is slidably installed on the chassis. One end of the rotating member is rotatably secured to the dragging member, the other end is rotatably secured to the supporting member. The supporting member is mounted to the chassis. The dragging member is moved to drive the sliding member to slide on the supporting member along a second direction which is substantially perpendicular to the bracket, and the clipping structure is slid along with the supporting member to drive the printed circuit board to slide along the second direction.

20 Claims, 7 Drawing Sheets

UNLOCKING APPARATUS FOR PRINTED CIRCUIT BOARD

BACKGROUND

1. Technical Field

The present disclosure relates to unlocking apparatuses for printed circuit boards, particularly to an unlocking apparatus which can conveniently detach a printed circuit board from a computer chassis.

2. Description of Related Art

To update a server, printed circuit boards, such as a motherboard or an expansion card, it may need to detach the server or the printed circuit boards from the chassis to repair or to replace some electronic components in the printed circuit boards. Usually, the printed circuit boards are secured to a limiting space in the bottom of the computer chassis. The printed circuit board may be detached manually from the chassis. Other electronic components may be damaged when detaching the printed circuit board.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
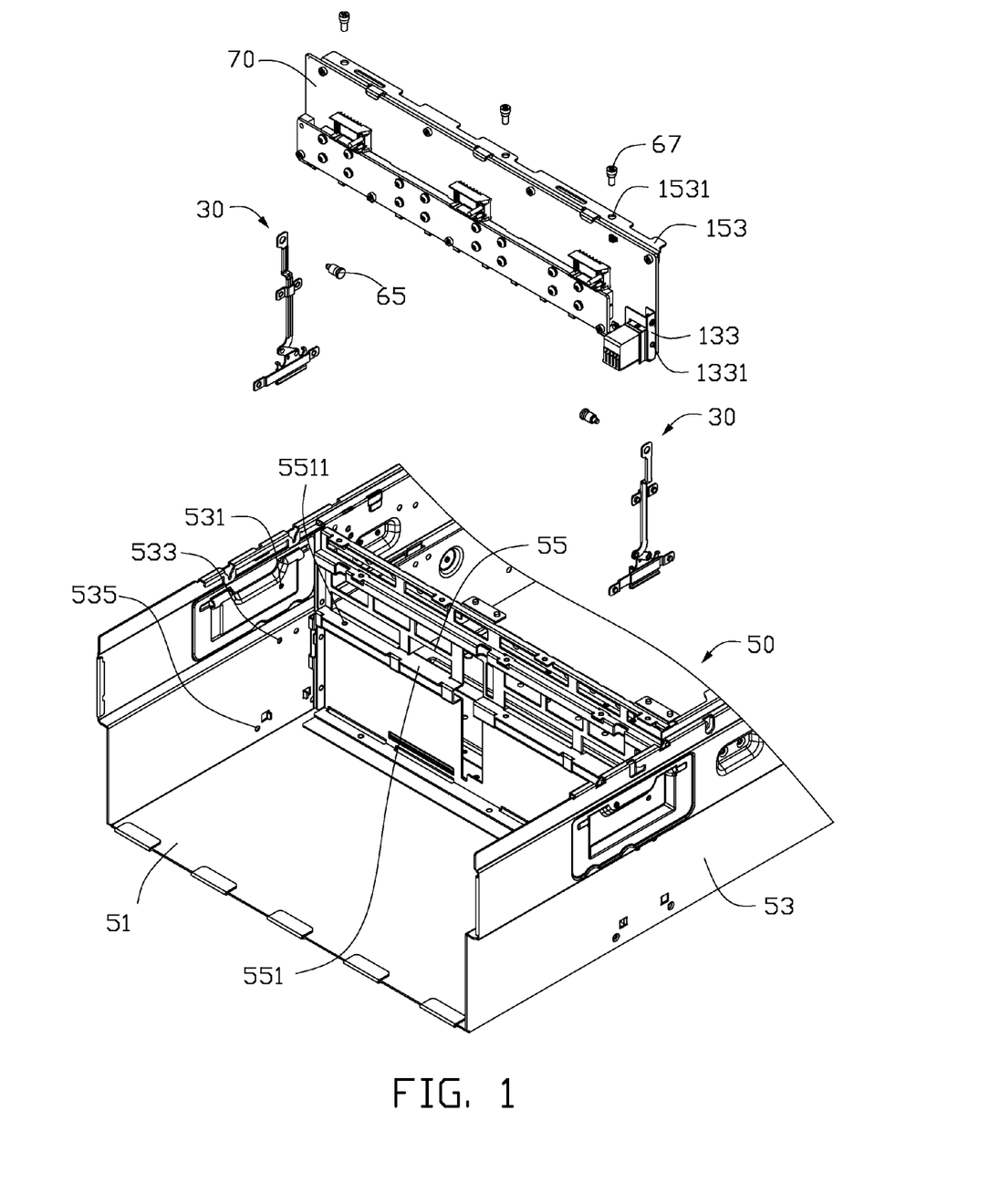
FIG. 1 is an exploded, isometric view of an embodiment of an unlocking apparatus and a printed circuit board.
Figure 2:
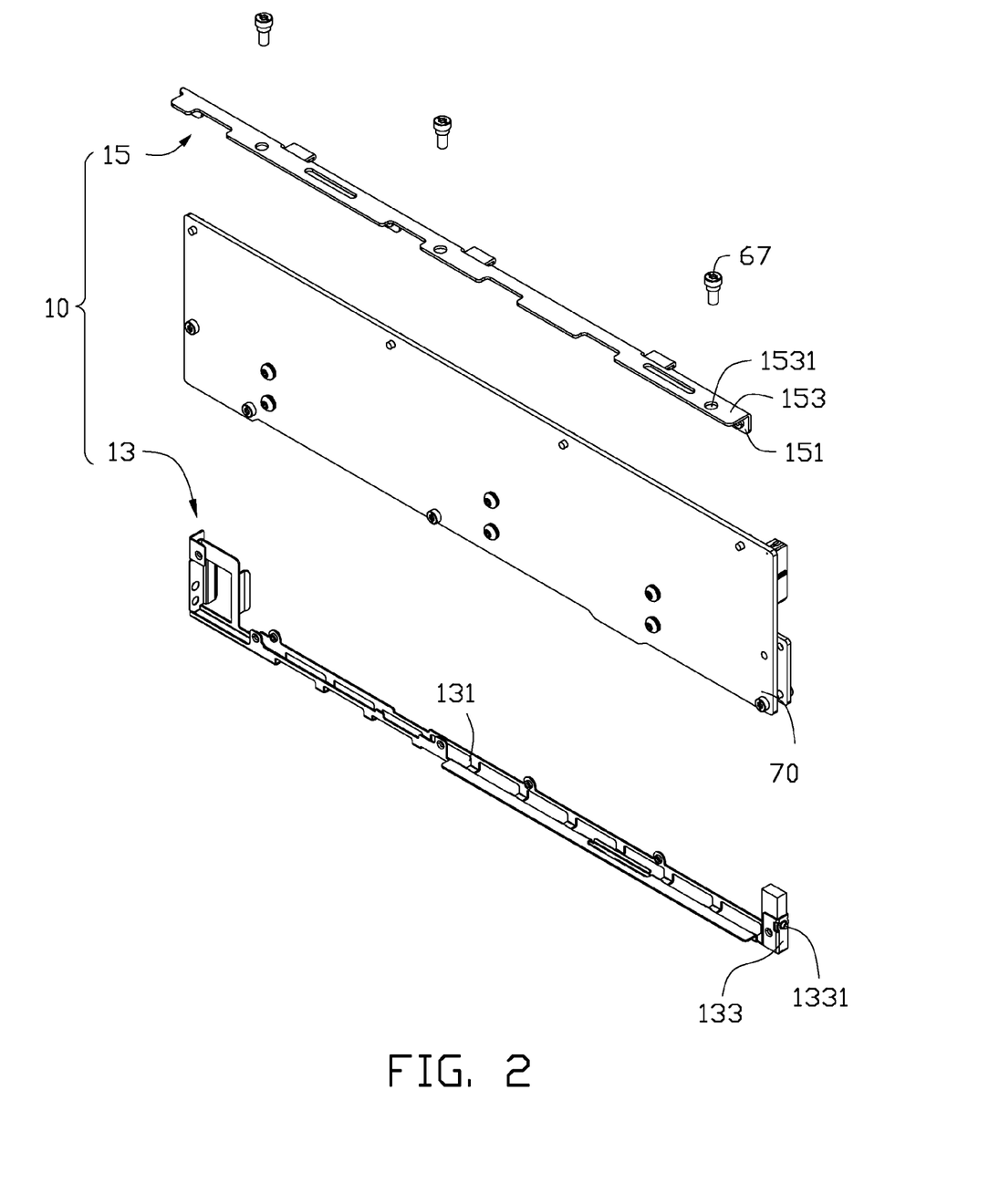
FIG. 2 is an exploded of the clipping structure and the printed circuit board of FIG. 1.

Referring to FIGS. 1 & 2, an unlocking apparatus in accordance with an embodiment includes a clipping structure 10, two unlocking structures 30, and a chassis 50. The unlocking apparatus is used to detach a printed circuit board 70 from the chassis 50.

The clipping structure 10 includes a first clipping member 13 and a second clipping member 15. A clipping groove 131 is defined on the first clipping member 13. The first clipping member 13 includes two connecting pieces 133. The two connecting pieces 133 separately extend from two ends of the clipping groove 131. In one embodiment, the two connecting pieces 133 are substantially parallel with each other. Two engaging portions 1331 are located on the first clipping member 13, and each of the two engaging portions 1331 extends from each of the two connecting pieces 133.

The second clipping member 15 includes a mounting board 151, and an engaging board 153 substantially perpendicular to the mounting board 151. Three engaging holes 1531 are defined in the engaging board 153.

Figure 3:
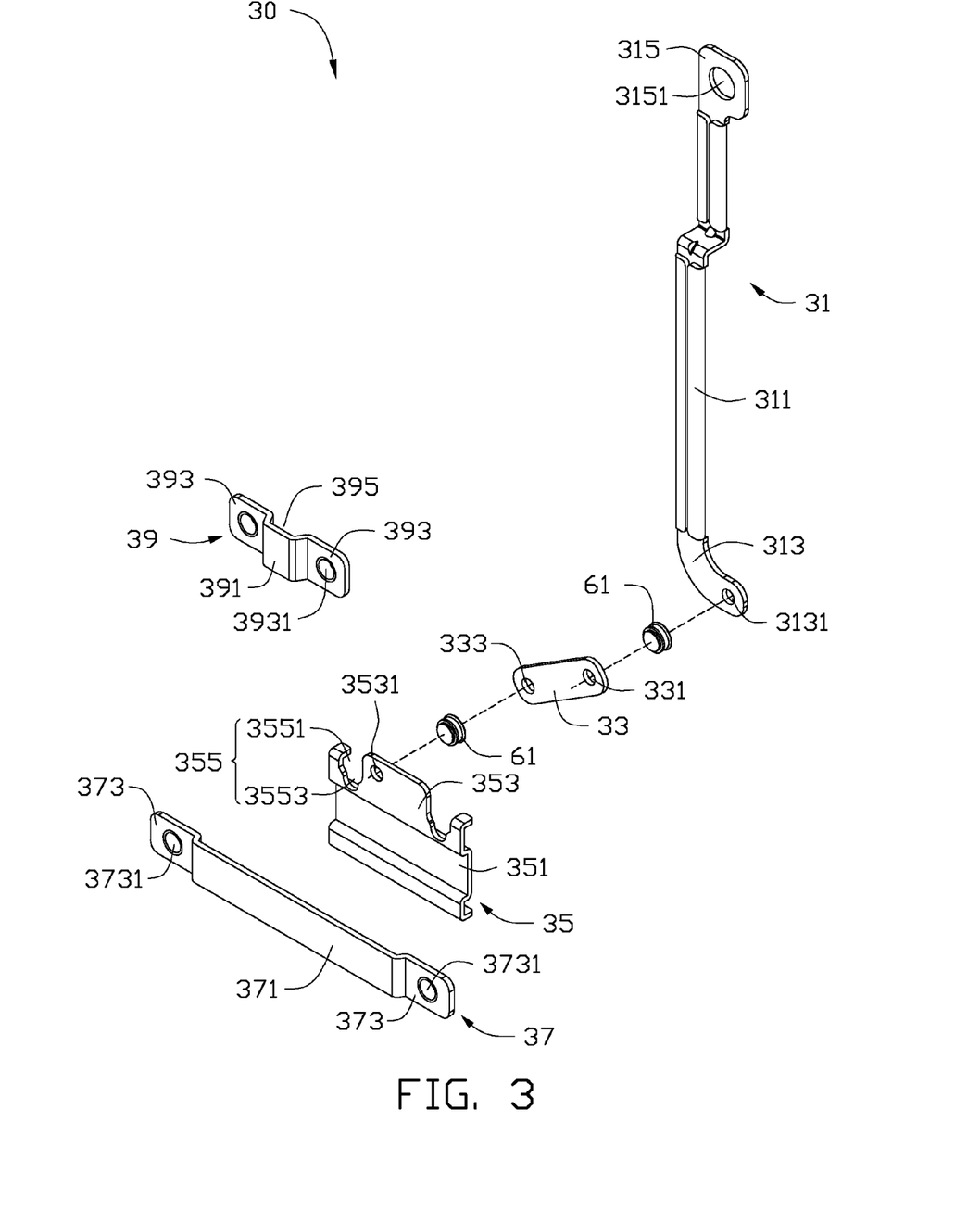
FIG. 3 is an exploded of the unlocking structure of FIG. 1.

Referring to FIG. 3, each of the two unlocking structures 30 includes a dragging member 31, a rotating member 33, a sliding member 35, a supporting member 37 and a positioning member 39. The dragging member 31 includes a connecting pole 311, a connecting portion 313 extending from one end of the connecting pole 311, and an operating portion 315 extending from another end of the connecting pole 311. In one embodiment, a first plane with the connecting portion 313 is substantially perpendicular to a second plane with the connecting pole 311. A connecting hole 3131 is defined in the connecting portion 313, and a through hole 3151 is defined in the operating portion 315.

A first rotating hole 331 and a second rotating hole 333 are defined in opposite ends of the rotating member 33.

A sliding groove 351 is defined on the sliding member 35. An installation board 353 extends from one edge of the sliding groove 351. A gap 355 is defined in one side of the installation board 353, and includes a wide portion 3551, and a narrow portion 3553 communicating with the wide portion 3551. A mounting hole 3531 is defined in the installation board 353.

The supporting member 37 includes a supporting portion 371, and two installation pieces 373. Each of the two installation pieces 373 extends from each of two opposite ends of the supporting portion 371. Two installation holes 3731 are defined in the two installation pieces 373, respectively.

The positioning member 39 includes a positioning portion 391, and two limiting portions 393. Each of the two limiting portions 393 extends from each of two opposite ends of the positioning portion 391. Two limiting holes 3931 are defined in the two limiting portions 393, respectively. A receiving groove 395 is defined between the two limiting portions 393.

The chassis 50 includes a bottom board 51, two sidewalls 53, and a bracket 55 located between the two sidewalls 53. Each of the two sidewalls 53 extends from each of two opposite edges of the bottom board 51. Each of the two sidewalls 53 defines a first stopper hole 531 corresponding to the through hole 3151, two second stopper holes 533 corresponding to the two limiting holes 3931, and two third stopper holes 535 corresponding to the two installation holes 3731.

A loading portion 551 is located on the bracket 55. Three latching holes 5511 are defined in the loading portion 551, for corresponding to the three engaging holes 1531. In one embodiment, the loading portion 551 is substantially parallel with the bottom board 51.

Figure 6:
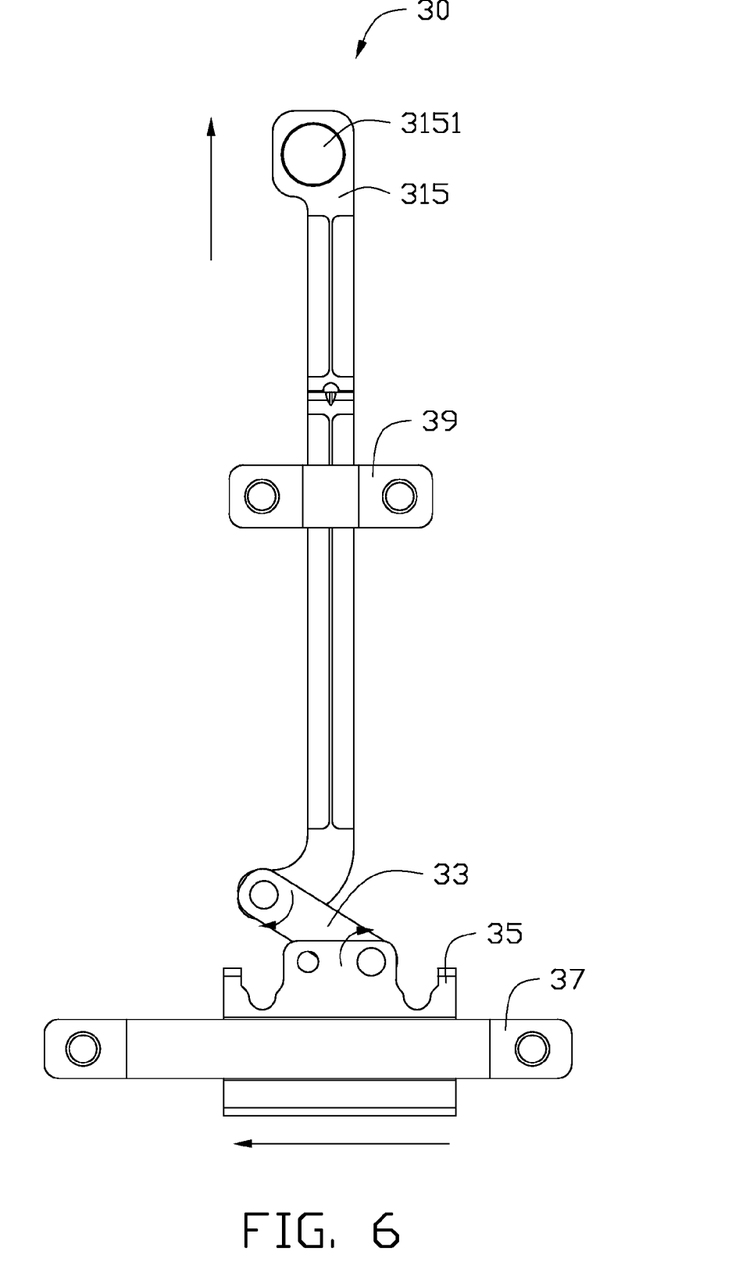
FIG. 6 is an assembled view of the unlocking structure of FIG. 1.

Referring to FIG. 6, in assembly of each of the two unlocking structures 30, the first rotating hole 331 of the rotating member 33 is aligned with the connecting hole 3131 of the dragging member 31, and a first mounting member 61 extends through the connecting hole 3131 and the first rotating hole 331 to rotatably secure one end of the rotating member 33 to the dragging member 31. The second rotating hole 333 of the rotating member 33 is aligned with the mounting hole 3531, and the first mounting member 61 extends through the second rotating hole 333 and the mounting hole 3531 (shown in FIG. 3) to rotatably secure another end of the rotating member 33 to the sliding member 35. The supporting portion 371 is slidably engaged in the sliding groove 351.

Figure 4:
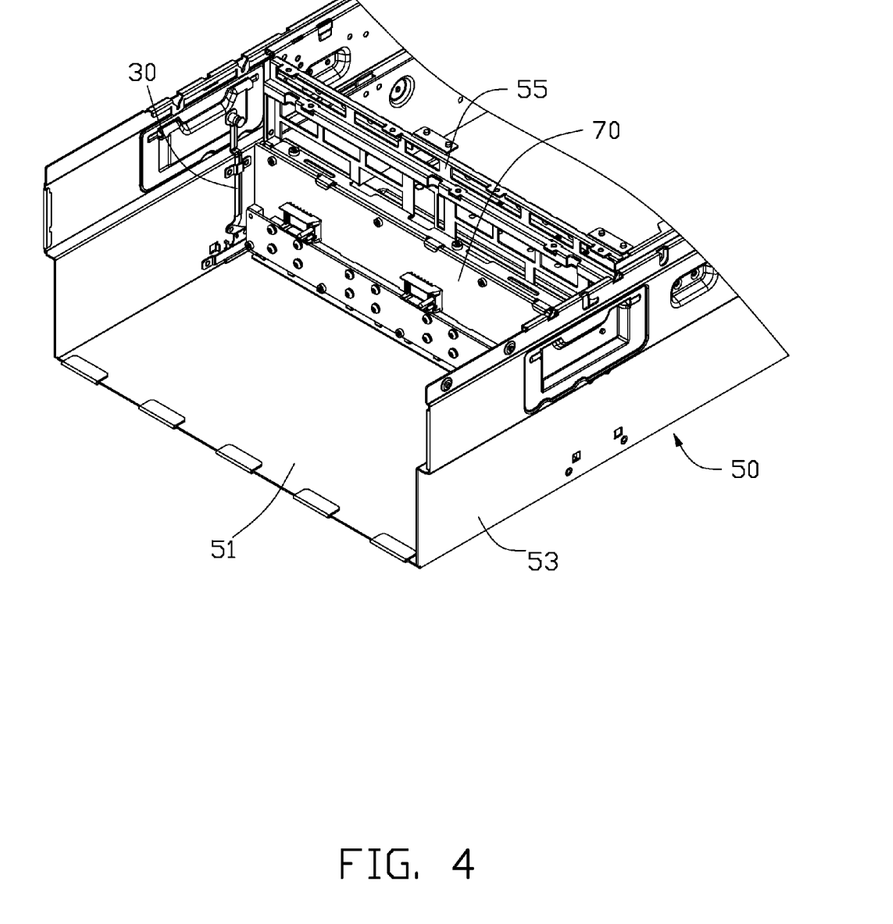
FIG. 4 is an assembled view of the unlocking apparatus and the printed circuit board of FIG. 1.
Figure 5:
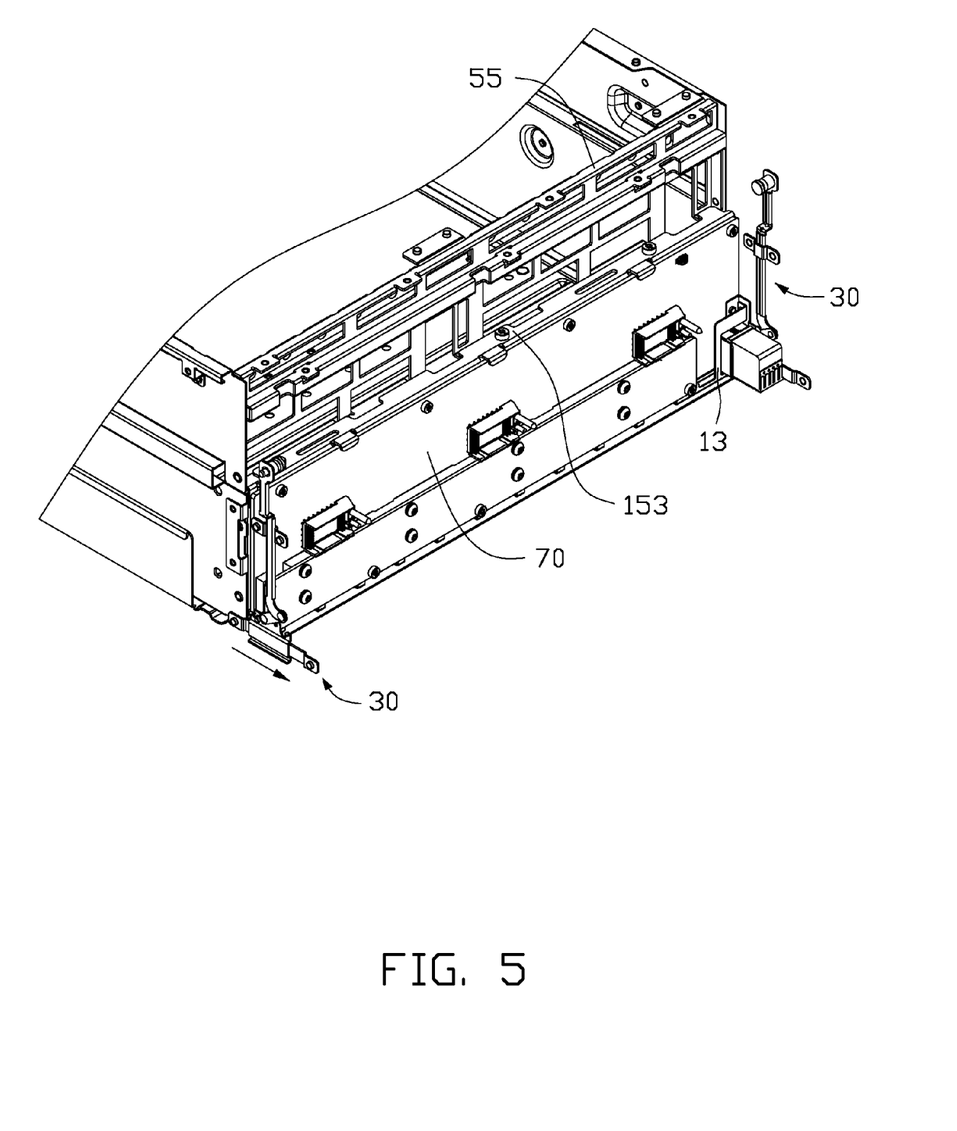
FIG. 5 is another assembled view of the unlocking apparatus and the printed circuit board of FIG. 1.

Referring to FIGS. 4 and 5, in assembly of each of the two unlocking structures 30 to each of the two sidewalls 53 of the chassis 50. Each of the two unlocking structures 30 abuts each of the two sidewalls 53. Each of the two installation holes 3731 in the supporting member 37 is aligned with each of the two third stopper holes 535, two second mounting members 65 extend through each of the two installation holes 3731 and each of the two third stopper holes 535 to secure the supporting member 37 of each of the two unlocking structures 30 to each of the two sidewalls 53. Each of the two limiting holes 3931 in each of the two supporting members 39 is aligned with each of the two second stopper holes 533. The two second mounting members 65 extend through each of the two limiting holes 3931 and each of the two second stopper holes 533 to secure the positioning member 39 of each of the two unlocking structures 30 to each of the two sidewalls 53. At this time, the connecting pole 311 can be slidably received in the receiving groove 395, the sliding member 35 is positioned between each of the two sidewalls 53 and the supporting member 37 of each of the two unlocking structures 30.

The first clipping member 13 and the second clipping member 15 are separately installed on opposite sides of the printed circuit board 70, respectively. In assemble of the printed circuit board 70 to the chassis 50, each of the two engaging portions 1331 extends through the wide portion 3551 to engaged in the narrow portion 3553 of the gap 355 in each of the two unlocking structures 30, the printed circuit board 70 is pushed toward the bracket 55 until the engaging board 153 abut above the loading portion 551. Thus, the engaging board 153 is in a first position, and the three engaging holes 1531 are aligned with corresponding the three latching holes 5511. Three third mounting members 67 separately extends through the corresponding three holes 1131 and the three latching holes 5511 to secure the printed circuit board 70 to the bracket 55. The through hole 3151 in each of the two unlocking structures 30 is aligned with the first stopper hole 531 in each of the two sidewalls 53. Two second mounting members 65 (shown in FIG. 1) separately extends through the through hole 3151 in each of the two unlocking structures 30 and the stopper hole 531 in each of the two sidewalls 53.

Figure 7:
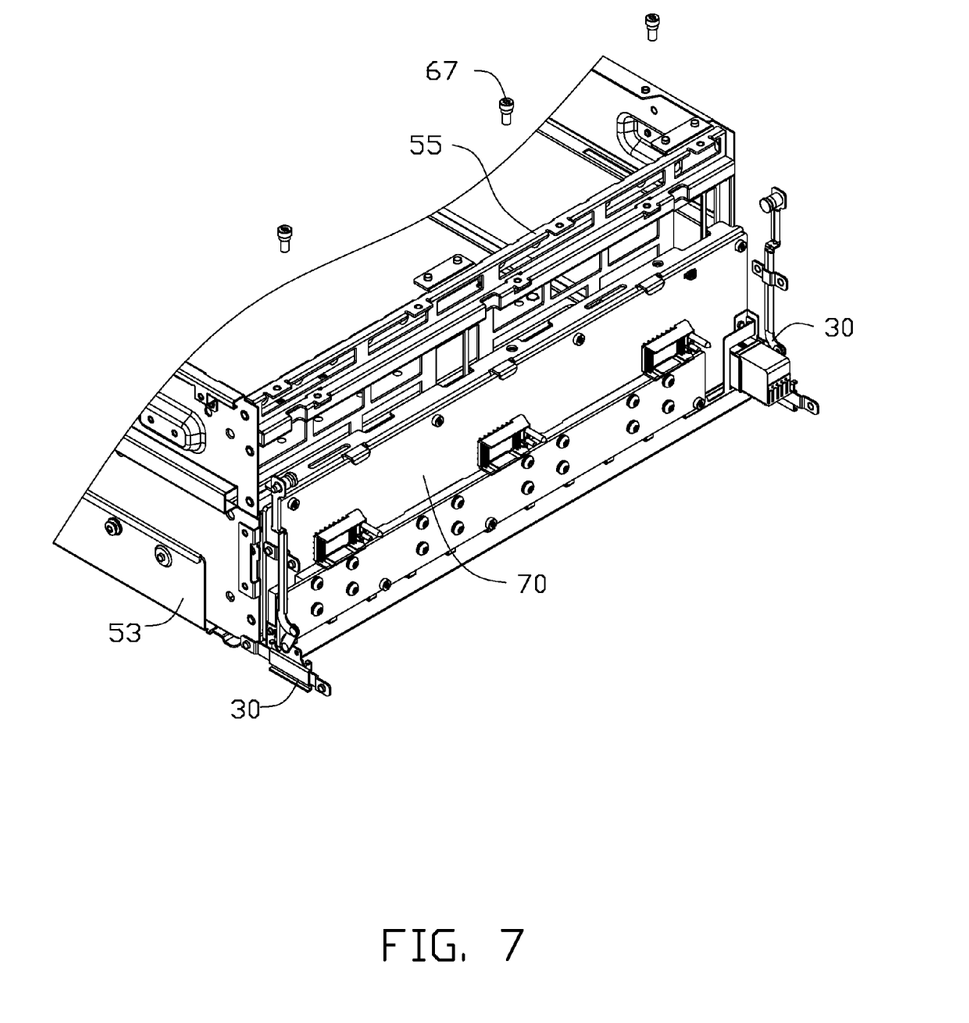
FIG. 7 is similar to FIG. 5, but the printed circuit board is detached from the bracket.

Referring to FIG. 7, in disassembly of the printed circuit board 70, the three third mounting members 67 are removed from the bracket 55, and the second mounting member 65 are removed from two unlocking structures 30. The dragging member 31 of each of the two unlocking structures 30 is pulled along a first direction to drive the rotating member 33 relative to the dragging member 31 to rotate in a third direction which is parallel with each of the two sidewalls 53, and the rotating member 33 relative to the sliding member 35 is rotated in a fourth direction opposite to the third direction. Thus, the sliding member 35 slides on the supporting portion 371 along a second direction which is perpendicular to the bracket 55, and the first clipping member 13 together sliding along the second direction until the engaging board 153 is disengaged from the loading portion 551. Therefore, the printed circuit board 70 can be detached from the chassis 50, and the engaging board 153 is in a second position. In one embodiment, the first direction is substantially perpendicular to the second direction.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. An unlocking apparatus comprising:
   a chassis comprising two sidewalls and a bracket located between the two sidewalls, a printed circuit board engaged in the bracket;
   two unlocking structures separately secured to each of the two sidewalls, each of the two unlocking structures comprising a dragging member, a rotating member, a sliding member and a supporting member, the dragging member slidably installed on each of the two sidewalls, one end of the rotating member rotatably mounted on the dragging member, another end of the rotating member rotatably mounted on the sliding member, the sliding member slidably installed on the supporting member, and the supporting member secured to each of the two sidewalls;
   a clipping structure secured to the printed circuit board, and engaged with each of the two unlocking structures;
   wherein the dragging member is configured to be moved along a first direction to drive the sliding member to slide on the supporting member along a second direction substantially perpendicular to the printed circuit board, and the clipping structure is configured to slide along with the supporting member to drive the printed circuit board to slide along the second direction.

2. The unlocking apparatus of claim 1, wherein the dragging member comprises a connecting pole and a connecting portion extending from the connecting pole, a first plane containing the connecting pole is substantially perpendicular to a second plane containing the connecting portion.

3. The unlocking apparatus of claim 1, wherein the first direction is substantially perpendicular to the second direction.

4. The unlocking apparatus of claim 1, wherein the rotating member is configure to be rotated relative to the dragging member along a third direction, and be rotated relative to the sliding member along a fourth direction opposite to the third direction.

5. The unlocking apparatus of claim 1, wherein the clipping structure comprises a first clipping member secured to the printed circuit board, the first clipping member comprises two engaging portions; each of the two unlocking structures defines a gap, and each of the two engaging portions is engaged in the gap.

6. The unlocking apparatus of claim 5, wherein the gap comprises a wide portion and a narrow portion communicating with the wide portion, and each of the engaging portions extends through the wide portion to engage in the narrow portion.

7. The unlocking apparatus of claim 1, wherein the sliding member of each of the two unlocking structures is slidably located between each of the two sidewalls and the supporting member of each of the two unlocking structures.

8. The unlocking apparatus of claim 7, wherein a sliding groove is defined in the sliding member, the supporting member comprises a supporting portion, and the supporting portion is slidably engaged in the sliding groove.

9. The unlocking apparatus of claim 2, wherein each of the two unlocking structures further comprises a positioning member, the connecting pole is slidably located between each of the two sidewalls and the positioning member.

10. The unlocking apparatus of claim 5, wherein the clipping structure further comprises a second clipping member secured to the printed circuit board, and a loading portion is located on the bracket; the second clipping member is configured to be moved between a first position and a second position, when the second clipping member is in the first position, the second clipping member is engaged with the loading portion; when the second clipping member is in the second position, the second clipping member is disengaged from the loading portion; the two unlocking structures are adapted to drive the second clipping member from the first position to the second position.

11. An unlocking apparatus comprising:
a chassis comprising two sidewalls and a bracket located between the two sidewalls;
two unlocking structures separately slidably secured to each of the two sidewalls;
a clipping structure comprising a first clipping member and a second clipping member, a printed circuit board located between the first clipping member and the second clipping member, the first clipping member engaged with each of the two unlocking structures; and
wherein the second clipping member is adapted to be moved between a first position and a second position, when the second clipping member is in the first position, the second clipping member is engaged with the bracket; when the second clipping member is in the second position, the second clipping member is disengaged from the bracket; the two unlocking structures are adapted to drive the second clipping member from the first position to the second position.

12. The unlocking apparatus of claim 11, wherein each of the two unlocking structures comprises a dragging member, a rotating member, a sliding member and a supporting member; the dragging member is slidably installed on the each of the two sidewalls, one end of the rotating member is rotatably mounted on the sliding member, the other end of the rotating member is rotatably mounted on the dragging member; the sliding member is slidably installed on the supporting member, and the supporting member is mounted on each of the two sidewalls; the dragging member is configure to be moved along a first direction to drive the sliding member to slide on the supporting member along a second direction substantially perpendicular to the bracket, and the clipping structure is configure to slide with the supporting member to drive the printed circuit board to slide along the second direction.

13. The unlocking apparatus of claim 12, wherein the first direction is substantially perpendicular to the second direction.

14. The unlocking apparatus of claim 12, wherein the rotating member is configure to be rotated relative to the dragging member along a third direction, and be rotated relative to the sliding member along a fourth direction opposite to the third direction.

15. The unlocking apparatus of claim 11, wherein the first clipping member comprises two connecting pieces, the two connecting pieces are parallel with each other.

16. The unlocking apparatus of claim 15, wherein the first clipping member further comprises two engaging portions, and each of the two engaging member extends from each of the two connecting pieces; each of the two unlocking structures defines a gap, and each of the two engaging portions is engaged in the gap.

17. The unlocking apparatus of claim 16, wherein the gap comprises a wide portion and a narrow portion communicating with the wide portion, each of the two engaging portions extends through the wide portion to engage in the narrow portion.

18. The unlocking apparatus of claim 12, wherein the dragging member comprises a connecting pole, each of the two unlocking structures further comprises a positioning member, the connecting pole is slidably located between each of the two sidewalls and the positioning member of each of the two unlocking structures.

19. The unlocking apparatus of claim 18, wherein the dragging member further comprises a connecting portion extending from the connecting pole, a first plane containing the connecting pole is substantially perpendicular to a second plane containing the connecting portion, and the rotating member is rotatably secured to the connecting portion.

20. The unlocking apparatus of claim 12, wherein the sliding member defines a sliding groove, the supporting member comprises a supporting portion, and the supporting portion is slidably engaged in the sliding groove.

* * * * *